United States Patent
Lee et al.

(10) Patent No.: US 12,457,822 B2
(45) Date of Patent: Oct. 28, 2025

(54) SOLAR CELL AND MANUFACTURING METHOD OF THE SAME

(71) Applicant: ELECTRONICS AND TELECOMMUNICATIONS RESEARCH INSTITUTE, Daejeon (KR)

(72) Inventors: Woo Jung Lee, Daejeon (KR); Yong-Duck Chung, Daejeon (KR); Daehyung Cho, Daejeon (KR); Myeong Eon Kim, Daejeon (KR); Taeha Hwang, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 64 days.

(21) Appl. No.: 18/483,909

(22) Filed: Oct. 10, 2023

(65) Prior Publication Data

US 2024/0128384 A1 Apr. 18, 2024

(30) Foreign Application Priority Data

Oct. 12, 2022 (KR) .......... 10-2022-0130642
Jun. 27, 2023 (KR) .......... 10-2023-0082725

(51) Int. Cl.
*H10F 77/20* (2025.01)
*H10F 19/85* (2025.01)
*H10F 77/30* (2025.01)

(52) U.S. Cl.
CPC .......... *H10F 77/219* (2025.01); *H10F 19/85* (2025.01); *H10F 77/315* (2025.01)

(58) Field of Classification Search
CPC ...... H10F 77/219; H10F 19/85; H10F 77/315; H10F 10/167; H10F 77/126; Y02E 10/541
See application file for complete search history.

(56) References Cited

U.S. PATENT DOCUMENTS 10,541,376 B2    1/2020  Lee et al.
2011/0083743 A1*  4/2011  Yamamoto ............ H10F 77/126
                                                     438/93
2012/0125425 A1   5/2012  Cho et al.
(Continued)

FOREIGN PATENT DOCUMENTS

JP       2014-103237 A    6/2014
KR    10-2012-0001842 A   1/2012
(Continued)

OTHER PUBLICATIONS

Lee ("Ultrafast wavelength-dependent carrier dynamics related to metastable defects in Cu(In,Ga)Se2 solar cells with chemically deposited Zn(O,S) buffer layer") Nano Energy 74 (2020) 104855 (Year: 2020).*

(Continued)

*Primary Examiner* — Angelo Trivisonno

(57) ABSTRACT

Provided is a solar cell and a manufacturing method thereof. The cell includes a back-contact electrode on a substrate, a light absorbing layer on the back-contact electrode, an anti-defect layer on the light absorbing layer, a buffer layer on the anti-defect layer, and an upper electrode on a buffer layer. The anti-defect layer may contain an alkaline earth metal.

6 Claims, 5 Drawing Sheets

(56) References Cited

U.S. PATENT DOCUMENTS

2014/0109963 A1    4/2014   Chung et al.
2022/0037553 A1    2/2022   Algasinger et al.

FOREIGN PATENT DOCUMENTS

| KR | 10-2014-0110152 A | 9/2014 |
| KR | 10-1523246 B1 | 6/2015 |
| KR | 10-2015-0124913 A | 11/2015 |
| KR | 10-2020-0100231 A | 8/2020 |
| KR | 10-2020-0117543 A | 10/2020 |
| KR | 10-2020-0132064 A | 11/2020 |
| KR | 10-2021-0050564 A | 5/2021 |

OTHER PUBLICATIONS

Chen ("Effect of calcium incorporation on properties of Cu(InGa)Se2 thin film and solar cell") Mater. Res. Express 6 (2019) 096430 (Year: 2019).*

Sang ("Performance improvement of CIGS-based modules by depositing high-quality Ga-doped ZnO windows with magnetron sputtering") Solar Energy Materials & Solar Cells 67 (2001) 237-245 (Year: 2001).*

Jieyi Chen et.al., "Engineered Cu(In,Ga)Se2 thin films through CaF2 post-deposition treatment for enhancing solar cell performance", Journal of Alloys and Compounds, 2018, 766, pp. 1046-1053.

* cited by examiner

SOLAR CELL AND MANUFACTURING METHOD OF THE SAME

CROSS-REFERENCE TO RELATED APPLICATIONS

This U.S. non-provisional patent application claims priority under 35 U.S.C. § 119 of Korean Patent Application Nos. 10-2022-0130642, filed on Oct. 12, 2022, and 10-2023-0082725, filed on Jun. 27, 2023, the entire contents of which are hereby incorporated by reference.

BACKGROUND

The present disclosure herein relates to a photoelectric conversion element and a manufacturing method thereof, and more particularly, to a solar cell and a manufacturing method thereof.

In general, the advantages of CIGS thin-film solar cells, which are based on copper, indium, gallium, and selenium materials, are that the CIGS thin-film solar cells can grow on flexible substrates compared to fragile silicon solar cells, and that the solar cell efficiency thereof is similar to that of polycrystalline silicon solar cells. A calcozinide-based $Cu(In_{1-x},Ga_x)Se_2$ (CIGS) thin film has a high light absorption coefficient, and thus, is a material suitable as an absorption layer for solar cells.

SUMMARY

The present disclosure provides a solar cell capable of improving a light wetting effect and maximizing photoelectric efficiency, and a manufacturing method thereof.

An embodiment of the inventive concept provides a solar cell. The cell includes a back-contact electrode on a substrate, a light absorbing layer on the back-contact electrode, an anti-defect layer on the light absorbing layer, a buffer layer on the anti-defect layer, and an upper electrode on the buffer layer. Here, the anti-defect layer may contain an alkaline earth metal.

In an embodiment, the anti-defect layer may have a thickness of 20 nm or less.

In an embodiment, the anti-defect layer may have a thickness of 5 nm or greater.

In an embodiment, the anti-defect layer may contain $MgF_2$.

In an embodiment, the light absorbing layer may contain CIGS.

In an embodiment, the buffer layer may contain CBD-Zn (O,S).

In an embodiment, the upper electrode may contain ITO.

In an embodiment, an insulation layer may be further included between the buffer layer and the upper electrode.

In an embodiment, the insulation layer may contain gallium zinc oxide.

In an embodiment of the inventive concept, a method for manufacturing a solar cell includes forming a back-contact electrode on a substrate, forming a light absorbing layer on the back-contact electrode, forming an anti-defect of layers on the light absorbing layer, forming a buffer layer on the anti-defect layer, and forming an upper electrode on the buffer layer. Here, the forming of the anti-defect layer may include heating the substrate to 550° C. to 590° C.

In an embodiment, the substrate may be heated to 570° C.

In an embodiment, the method may further include forming an insulation layer between the buffer layer and the upper electrode.

In an embodiment, the light absorbing layer may contain CIGS, and the anti-defect layer may be formed during the supply of Se in the CIGS. In an embodiment, the anti-defect layer may be formed with subsequent thermal deposition treatment.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
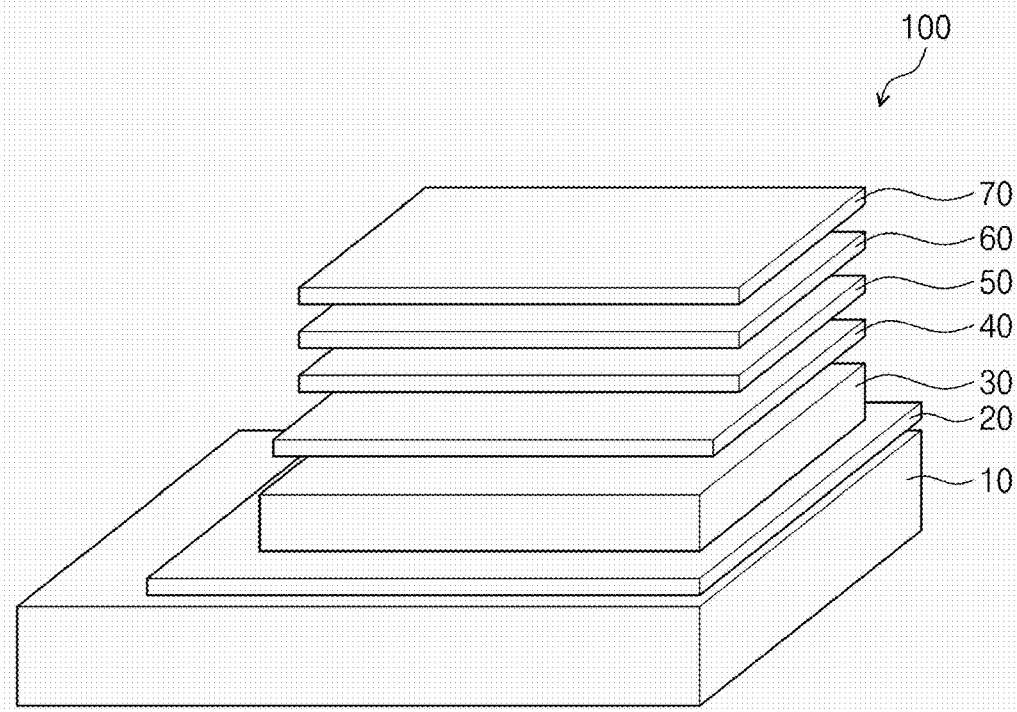
FIG. 1 is a perspective view showing an example of a solar cell according to the inventive concept.

Hereinafter, preferred embodiments of the present invention will be described in detail with reference to the accompanying drawings. Advantages and features of the inventive concept and methods of accomplishing the same may be understood more readily by reference to the following detailed description of exemplary embodiments and the accompanying drawings. However, the inventive concept is not limited to the embodiments described herein, and may be embodied in other forms. Rather, the embodiments introduced herein are provided to ensure that the disclosed contents may be thorough and complete, and that the spirit of the inventive concept may be sufficiently conveyed to those skilled in the art, and the inventive concept is only defined by the scope of claims. The same reference numerals refer to like elements throughout the specification.

The terms used herein are for the purpose of describing embodiments and are not intended to be limiting of the present invention. In the present disclosure, singular forms include plural forms unless the context clearly indicates otherwise. As used herein, the terms "comprises" and/or "comprising" are intended to be inclusive of the stated elements, steps, operations and/or devices, and do not exclude the possibility of the presence or the addition of one or more other elements, steps, operations, and/or devices. In addition, since the present specification is according to a preferred embodiment, reference numerals presented according to the order of description are not necessarily limited to the order. In addition, in the present specification, when a film is referred to as being on another film or substrate, it means that the film may be directly formed on another film or substrate, or that a third film may be interposed therebetween.

In addition, embodiments described in the present specification will be described with reference to cross-sectional views and/or plan views which are ideal illustrations of the inventive concept. In the drawings, the thickness of films and regions are exaggerated for an effective description of technical contents. Accordingly, the shape of an example may be modified by manufacturing techniques and/or tolerances. Thus, the embodiments of the inventive concept are not limited to specific forms shown, but are intended to include changes in the form generated by a manufacturing process. Thus, the regions illustrated in the drawings have properties, and the shapes of the regions illustrated in the drawings are intended to exemplify specific shapes of regions of a device and are not intended to limit the scope of the inventive concept. For example, fluid and polymer layers formed curved may be formed flat. Thus, the regions illustrated in the drawings have schematic properties, and the shapes of the regions illustrated in the drawings are intended to exemplify specific shapes of regions of a device and are not intended to limit the scope of the inventive concept.

FIG. 1 shows an example of a solar cell 100 according to the inventive concept.

Referring to FIG. 1, the solar cell 100 of the present invention may include a substrate 10, a back-contact electrode 20, a light absorbing layer 30, an anti-defect layer 40, a buffer layer 50, an insulation layer 60, and an upper electrode 70.

The substrate 10 may include any one of a glass substrate, a plastic substrate, a metal substrate, or polyimide substrate. For example, the substrate 10 may include a soda lime glass substrate. The substrate 10 may be rigid or flexible.

The back-contact electrode 20 may be provided on the substrate 10. The back-contact electrode 20 may include a metal material. For example, the rear electrode 20 may contain molybdenum (Mo). Alternatively, the back-contact electrode 20 may contain aluminum (Al), but the embodiment of the inventive concept is not limited thereto.

The light absorbing layer 30 may contain $Cu(In_{1-x},Ga_x)Se_2$ (CIGS) or $Cu_2ZnSnS_4$. According to an example, the light absorbing layer 30 may include a copper-indium-gallium-selenide-based(CU(In,Ga)Se; CIGS-based) crystal structure. CIGS may have a formula of $Cu(In_{1-x},Ga_x)Se_2$ by adjusting the amount of Ga in CuInSe. The light absorbing layer 30 may be further doped with Al, S, Ag, or the like to increase light absorption efficiency. Alternatively, the light absorbing layer 30 may include any one of absorbing layers doped with sulfur (S). The light absorbing layer 30 may be provided on the back-contact electrode 20. The light absorbing layer 30 may include a semiconductor material of a first conductive type. The semiconductor material of the first conductive type may include a Group I-III-VI-compound. The first conductive type may be any one of p-type or n-type.

The anti-defect layer 40 may be provided on the light absorbing layer 30. According to an example, the anti-defect layer 40 may contain an alkaline earth metal. For example, the anti-defect layer 40 may contain $MgF_2$. The buffer layer 50 may be provided on the anti-defect layer 40.

The buffer layer 50 may contain at least one of ZnS, $In_xS_y$, or $In_xSe_yZn(O, OH)$. The buffer layer 50 may include a semiconductor material of a second conductive type. The second conductive type may be any one of p-type or n-type. The second conductive type may correspond to a conductive type different from the first conductive type. That is, as an example, when the first conductive type is p-type, the second conductive type may be n-type.

The insulation layer 60 may be provided on the buffer layer 50. The insulation layer 60 may contain gallium zinc oxide (GZO). The insulation layer 60 may serve to prevent leakage current.

The upper electrode 70 may be provided on the insulation layer 60. The upper electrode 70 may be transparent. The upper electrode 70 may contain indium tin oxide (ITO).

In general, the buffer layer 50 may include a CdS material. Since Cd is a heavy metal, research on the buffer layer 50 of a Cd-free Zn-based material is actively being conducted. The buffer layer 50 of a Zn-based material may induce p-n junction defects such as a light wetting effect due to an interaction with the light absorption layer 30 of CIGS. The anti-defect layer 40 is provided between the light absorbing layer 30 and the buffer layer 50, and thus, may reduce or prevent the p-n junction defects.

Figure 2:
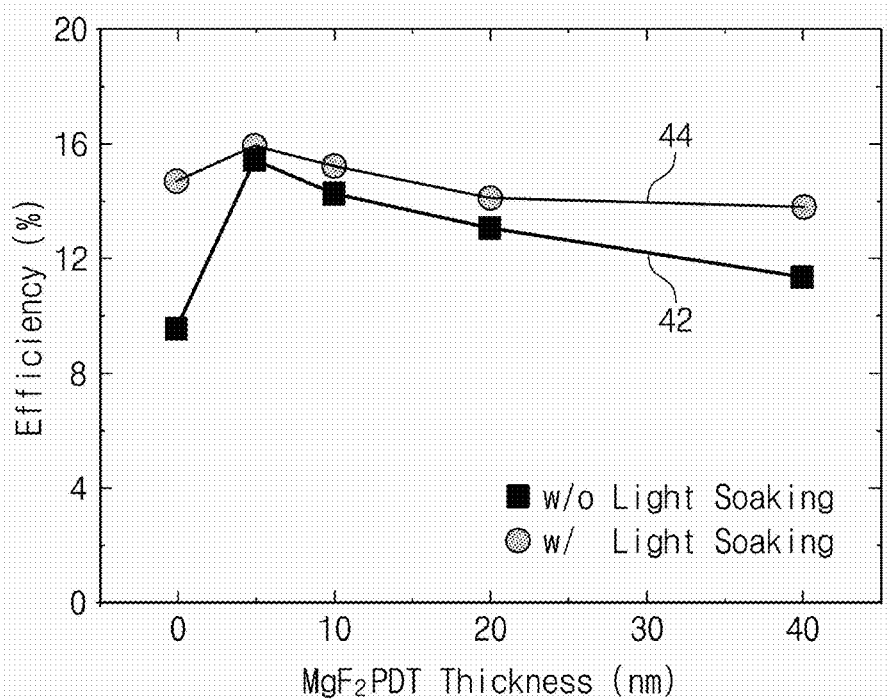
FIG. 2 is graphs showing first initial photoelectric conversion efficiency and first saturated photoelectric conversion efficiency according to the thickness of the anti-defect layer of FIG. 1.

FIG. 2 shows a first initial photoelectric conversion efficiency 42 and a first saturated photoelectric conversion efficiency 44 according to the thickness of the anti-defect layer 40 of FIG. 1.

Referring to FIG. 2, the anti-defect layer 40 having a thickness of about 20 nm or less could have the first initial photoelectric conversion efficiency 42 and the first saturated photoelectric conversion efficiency 44, which are excellent. According to an example, the anti-defect layer 40 may have a thickness of about 5 nm to about 40 nm. When the anti-defect layer 40 has a thickness of about 5 nm, the first initial photoelectric conversion efficiency 42 and the first saturated photoelectric conversion efficiency 44 may have a maximum value of about 16%. When the anti-defect layer 40 has a thickness of about 10 nm, the first initial photoelectric conversion efficiency 42 and the first saturated photoelectric conversion efficiency 44 may be about 14% and about 15%, respectively. When the anti-defect layer 40 has a thickness of about 20 nm, the first initial photoelectric conversion efficiency 42 and the first saturated photoelectric conversion efficiency 44 may be about 13% and about 14%, respectively. A value of difference between the first initial photoelectric conversion efficiency 42 and the first saturated photoelectric conversion efficiency 44 may be about 1% or less. The value of difference between the first initial photoelectric conversion efficiency 42 and the first saturated photoelectric conversion efficiency 44 may correspond to a photoelectric conversion delay effect or photoelectric conversion delay time. The anti-defect layer 40 having a thickness of about 5 nm to about 20 nm may reduce the photoelectric conversion delay time, and improve a light wetting effect.

When there is no anti-defect layer 40, the first initial photoelectric conversion efficiency 42 and the first saturated photoelectric conversion efficiency 44 may be about 9% and about 14.5%, respectively. When the anti-defect layer 40 has a thickness of about 40 nm, the first initial photoelectric conversion efficiency 42 and the first saturated photoelectric conversion efficiency 44 may be about 12% and about 16%, respectively. When there is no anti-defect layer 40, or the anti-defect layer 40 has a thickness of about 40 nm, the photoelectric conversion delay time may increase due to the light wetting effect.

Figure 3:
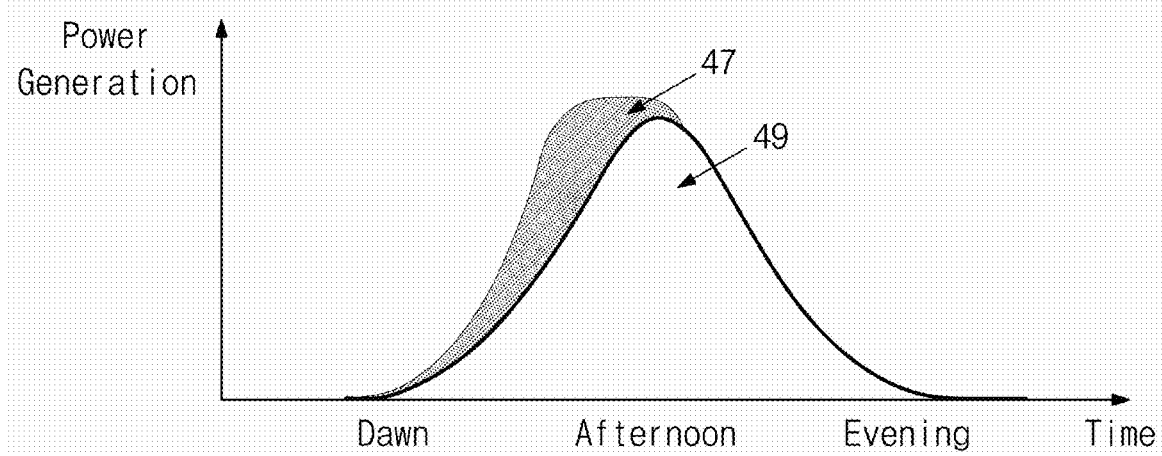
FIG. 3 is graphs showing an example of an additional power generation gain using the anti-defect layer of FIG. 1 and a general power generation gain requiring light wetting.

FIG. 3 shows an example of an additional power generation gain 47 using the anti-defect layer 40 of FIG. 1 and a typical power generation gain 49 requiring light wetting.

Referring to FIG. 3, the solar cell 100 of the present invention may have the typical power generation gain 49 requiring light wetting as well as the additional power generation gain 47.

Therefore, the solar cell 100 of the present invention may improve the light wetting effect and maximize the photoelectric conversion efficiency by using the anti-defect layer 40 having a thickness of about 20 nm or less.

A method for manufacturing the solar cell 100 of the present invention configured as described above will be described as follows.

Figure 4:
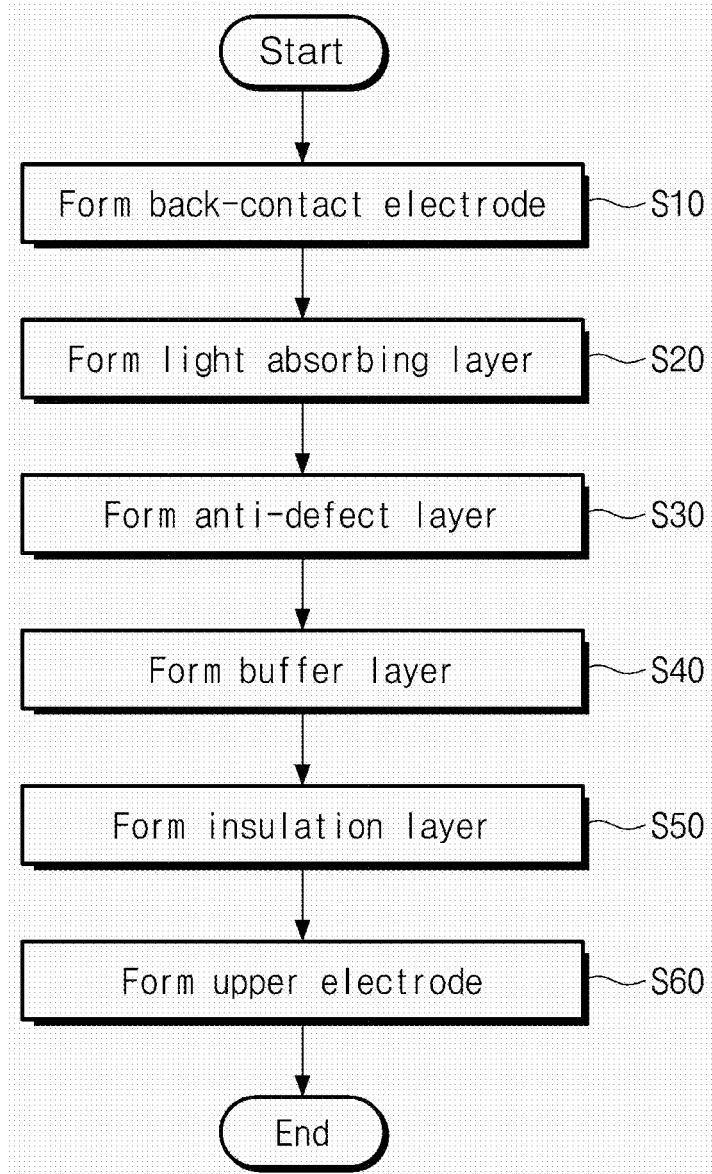
FIG. 4 is a flow chart showing a method for manufacturing a solar cell of the inventive concept.

FIG. 4 shows a method for manufacturing the solar cell 100 of the present invention.

Referring to FIG. 1 and FIG. 4, a back-contact electrode 20 is formed on a substrate 10 S10.

Next, a light absorbing layer 30 is formed on the back-contact electrode 20 S20. The light absorbing layer 30 may contain CIGS formed by a MBE method or CVD method.

Next, an anti-defect layer 40 is formed on the light absorbing layer 30 S30. The anti-defect layer 40 may contain an alkaline earth metal formed by in-situ with the light absorbing layer 30.

Figure 5:
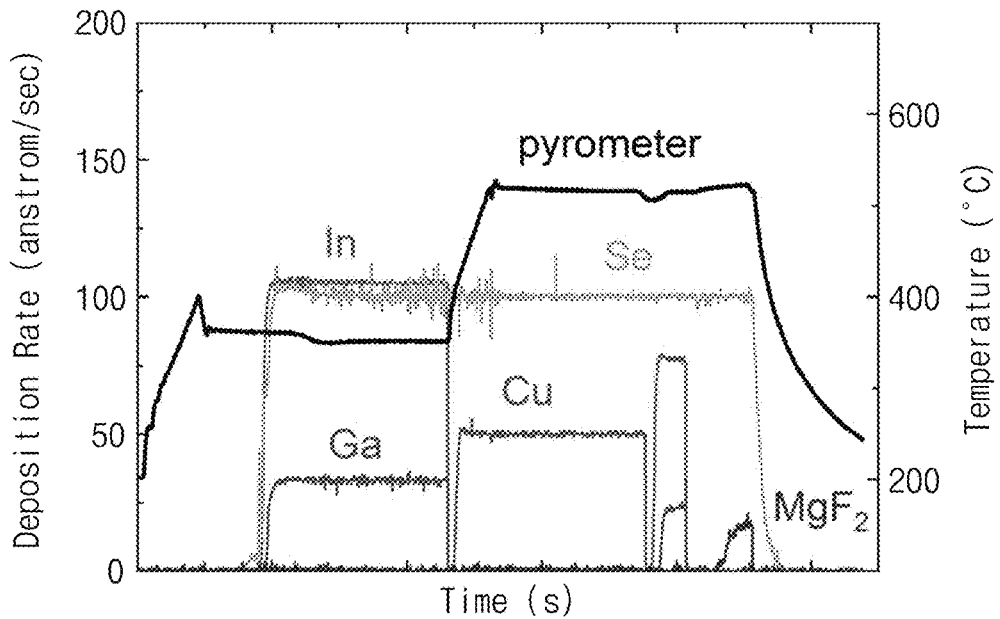
FIG. 5 is graphs showing a method for forming the light absorbing layer and the anti-defect layer of FIG. 1.

FIG. 5 shows how to form the light absorbing layer 30 and the anti-defect layer 40 of FIG. 1.

Referring to FIG. 5, Ga and In of the light absorbing layer 30 may be provided simultaneously on the substrate 10, Cu may be provided subsequent to Ga and In, and Se may be provided simultaneously with In and Ga and provided continuously after Cu. Ga and In may be provided on substrate 10 again after the supply of Cu.

The anti-defect layer 40 may be formed on the substrate 10 during the supply of Se after the re-supply of Ga and In of the light absorbing layer 30. The anti-defect layer 40 may be annealed through a post-deposition treatment process. The post-deposition treatment process may include a high-temperature heat treatment process. For example, the post-deposition treatment process of the anti-defect layer 40 may be performed at a high temperature of about 350° C. or higher.

Figure 6:
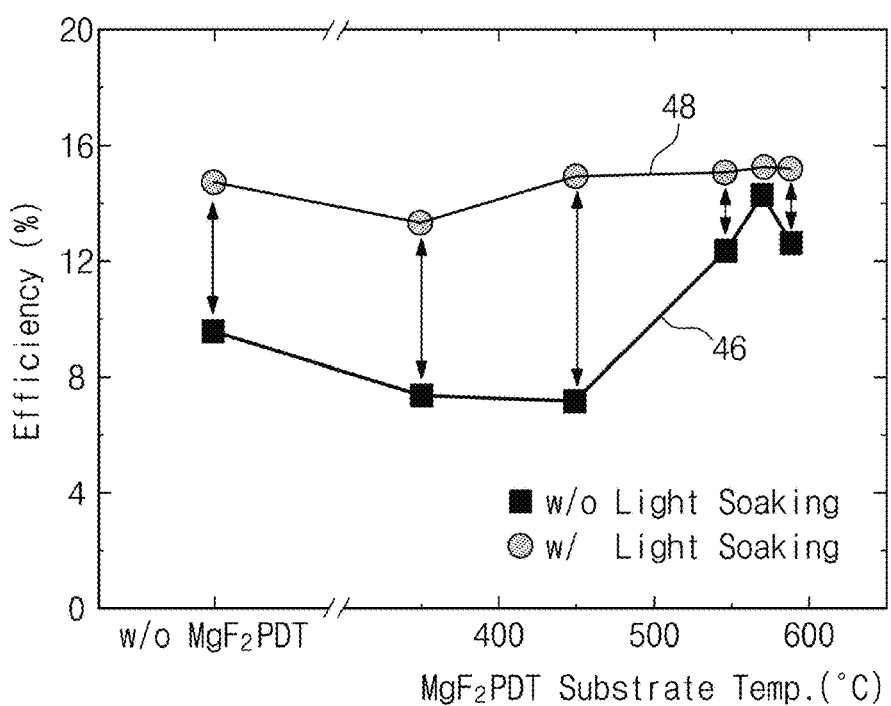
FIG. 6 is graphs showing second initial photoelectric conversion efficiency and second saturated photoelectric conversion efficiency according to the temperature of a treatment process after the deposition of the anti-defect layer of FIG. 5.

FIG. 6 shows a second initial photoelectric conversion efficiency 46 and a second saturated photoelectric conversion efficiency 48 according to the temperature of the post-deposition treatment of the anti-defect layer 40 of FIG. 5.

Referring to FIG. 6, the anti-defect layer 40 heated to about 550° C. to about 590° C. may have the second initial photoelectric conversion efficiency 46 and the second saturated photoelectric conversion efficiency 48 of about 12% to about 15%, which are excellent. The anti-defect layer 40 heated to about 570° C. may have the second initial photoelectric conversion efficiency 46 and the second saturated photoelectric conversion efficiency 48 of the highest peak of about 15%. The second initial photoelectric conversion efficiency 46 and the second saturated photoelectric conversion efficiency 48 of the anti-defect layer 40 heated to about 550° C. to about 590° C. may have a difference of about 2.5% or less. The light wetting effect may be improved.

When the anti-defect layer 40 is not heated or heated to about 450° C. or lower, the second initial photoelectric conversion efficiency 46 may be as low as about 7% to about 9%, and the second saturated photoelectric conversion efficiency 48 may be as high as about 14% to about 15%. The second initial photoelectric conversion efficiency 46 and the second saturated photoelectric conversion efficiency 48 may have a difference of about 6% to about 7%. The light wetting effect may not be improved.

Figure 7:
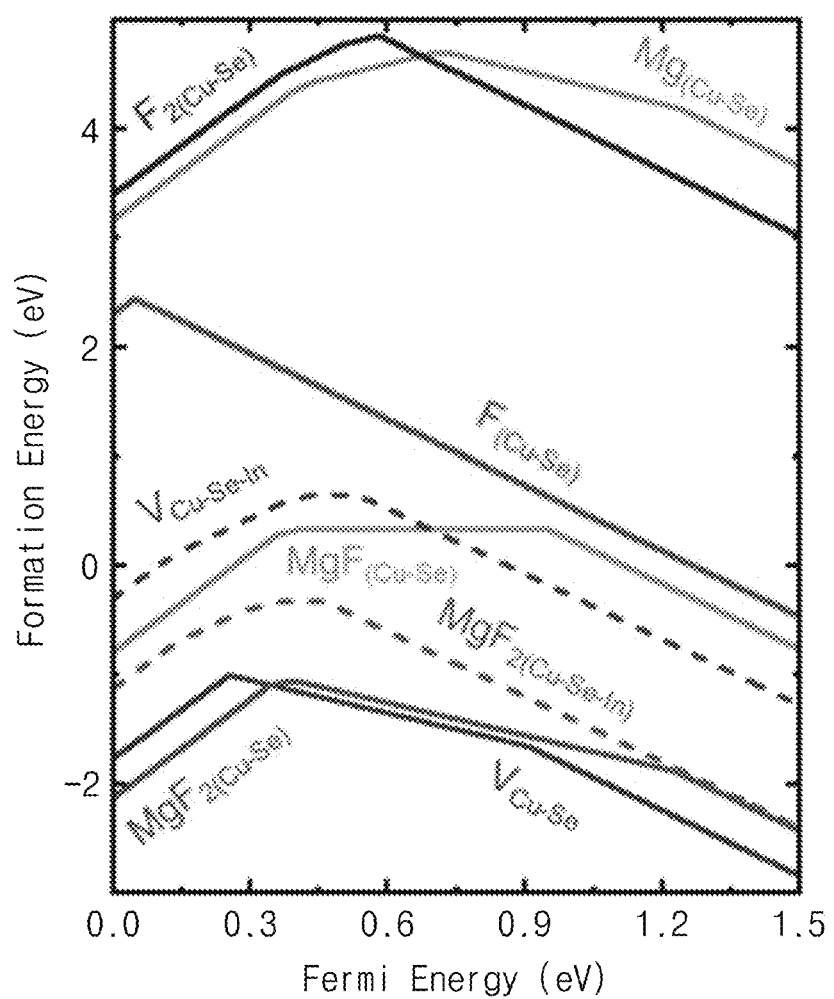
FIG. 7 is graphs showing the presence of the anti-defect layer in the light absorbing layer of FIG. 1.

FIG. 7 shows the presence of the anti-defect layer 40 in the light absorbing layer 30 of FIG. 1.

Referring to FIG. 7, phases of Mg, F, MgF, and $MgF_2$ of the anti-defect layer 40 may be stably substituted for a defect (e.g., Cu—Se) present at the GIGS/CBD-Zn(O,S) interface of the light absorbing layer 30, thereby eliminating the defect.

Referring back to FIG. 1 and FIG. 4, a buffer layer 50 is formed on the anti-defect layer 40 S40. The buffer layer 50 may contain ZnS, InS, or InSeZn(O,H) formed by a physical vapor deposition method.

Next, an insulating layer 60 is formed on the buffer layer 50 S50. The insulation layer 60 may contain gallium zinc oxide (GZO) formed by the physical vapor deposition method.

Next, an upper electrode 70 is formed on the insulation layer 60 S60. The upper electrode 70 may contain ITO formed by the physical vapor deposition method of a sputtering process.

Therefore, the method for manufacturing the solar cell 100 of the present invention may improve the light wetting effect and maximize the photoelectric conversion efficiency by using the anti-defect layer 40 heated to about 550° C. to about 590° C.

As described above, a solar cell according to the concept of the present invention has a thickness of about 20 nm or less, and uses an anti-defect layer heat-treated at a temperature of about 550° C. to about 590° C., and thus, may improve a light wetting effect and maximize photoelectric efficiency.

Although the embodiments of the present invention have been described with reference to the accompanying drawings, those skilled in the art will understand that the present invention can be implemented in other specific forms without changing the technical spirit or essential features thereof. Therefore, the embodiments described above should be understood as illustrative in all respects and not restrictive.

The scope of the present invention is defined by the appended claims rather than the detailed description, and all changes or modified embodiments derived from the meaning and scope of the claims and their equivalent concepts should be construed as being included in the scope of the present invention.

What is claimed is:

1. A solar cell comprising:
   a back-contact electrode disposed on a substrate;
   a light absorbing layer disposed on the back-contact electrode, the light absorbing layer including CIGS;
   an anti-defect layer on the light absorbing layer;
   a buffer layer disposed on the anti-defect layer, the buffer layer containing zinc (Zn) and sulfur(S); and
   an upper electrode on the buffer layer,
   wherein the anti-defect layer has a thickness of 5 nm to 10 nm and contains magnesium (Mg) having an atomic mass lower than that of the sulfur(S) of the buffer layer.

2. The solar cell of claim 1, wherein the anti-defect layer contains $MgF_2$.

3. The solar cell of claim 1, wherein the buffer layer contains CBD-Zn (O,S).

4. The solar cell of claim 1, wherein the upper electrode contains ITO.

5. The solar cell of claim 1, further comprising an insulation layer between the buffer layer and the upper electrode.

6. The solar cell of claim 1, wherein the insulation layer contains gallium zinc oxide.

\* \* \* \* \*